(12) United States Patent
Ono et al.

(10) Patent No.: US 7,564,097 B2
(45) Date of Patent: Jul. 21, 2009

(54) TRENCH-GATED MOSFET INCLUDING SCHOTTKY DIODE THEREIN

(75) Inventors: Syotaro Ono, Yokohama (JP); Akio Nakagawa, Fujisawa (JP); Yusuke Kawaguchi, Miura-gun (JP); Yoshihiro Yamaguchi, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 11/740,045

(22) Filed: Apr. 25, 2007

(65) Prior Publication Data

US 2007/0194372 A1 Aug. 23, 2007

Related U.S. Application Data

(62) Division of application No. 11/127,224, filed on May 12, 2005, now Pat. No. 7,230,297.

(30) Foreign Application Priority Data

May 14, 2004 (JP) ............................. 2004-145265
Apr. 8, 2005 (JP) ............................. 2005-112645

(51) Int. Cl.
*H01L 29/94* (2006.01)
(52) U.S. Cl. ............................ 257/330; 257/E29.013
(58) Field of Classification Search ............. 257/330, 257/E29.013
See application file for complete search history.

(56) References Cited

U.S. PATENT DOCUMENTS 4,823,172 A  4/1989  Mihara
6,040,600 A  3/2000  Uenishi et al.
6,049,108 A  4/2000  Williams et al.
6,433,396 B1 *  8/2002  Kinzer ................ 257/369
6,762,098 B2  7/2004  Hshieh et al.

FOREIGN PATENT DOCUMENTS

| JP | 62-296474 | 12/1987 |
| JP | 9-102602 | 4/1997 |
| JP | 11-251573 | 9/1999 |
| JP | 2003-17701 | 1/2003 |

OTHER PUBLICATIONS

Cheng et al., "Improving the CoolMOS™ Body-Diode Switching Performance with Integrated Schottky Contacts", Proc. ISPSD '03, Cambridge, UK, pp. 304-307, Apr. 2003.

* cited by examiner

*Primary Examiner*—Thomas L Dickey
(74) *Attorney, Agent, or Firm*—Oblon, Spivak, McClelland, Maier & Neustadt, P.C.

(57) ABSTRACT

Disclosed is a trench MOSFET, including: a trench gate structure having a gate electrode and a gate insulating film; an n-type diffusion layer formed to face the gate electrode via the gate insulating film at an upper portion of the trench; a p-type base layer formed to face the gate electrode via the gate insulating film at a lower portion than the upper portion; an n-type epitaxial layer locating to face the gate electrode via the gate insulating film at a further lower portion than the lower portion; a metal layer formed departing from the trench in parallel with a depth direction of the trench, penetrating the n-type diffusion layer and the p-type base layer, to reach the n-type epitaxial layer; and a p-type layer with higher impurity concentration than the p-type base layer, locating to be in contact with the p-type base layer and the metal layer.

6 Claims, 12 Drawing Sheets

TRENCH-GATED MOSFET INCLUDING SCHOTTKY DIODE THEREIN

CROSS-REFERENCE TO THE INVENTION

This application is a division of and claims the benefit of priority under 35 U.S.C. §120 from U.S. Ser. No. 11/127,224, filed May 12, 2005, and claims the benefit of priority from the prior Japanese Patent Application No. 2004-145265, filed on May 14, 2004 and the prior Japanese Patent Application No. 2005-112645, filed on Apr. 8, 2005; the entire contents of each application are incorporated herein by reference.

BACKGROUND

1. Field of the Invention

The present invention relates to a trench MOSFET including a gate electrode having a trench gate structure, and particularly to the trench MOSFET in which parallel schottky diodes are formed and housed between a source and a drain thereof.

2. Description of the Related Art

In a step down DC-DC converter, a MOSFET is used as a switching (chopping) element. During a period of current interruption from a primary side to a secondary side by the switching, a structure to flow back the current by a flywheel diode is generally used so as not to interrupt the current at a load side. However, in accordance with a requirement for a DC-DC converter having a low output voltage at the load side, a forward voltage drop of the above-stated diode cannot be ignored as a loss. Consequently, a structure is also used, in which a passage between a source and a drain of another MOSFET (second MOSFET) is used instead of the diode, and it is turned on for the same period as the period when the diode is conducting. As a typical MOSFET used for such a purpose, there is so-called a trench MOSFET having a trench gate structure.

In the above-stated structure, it is difficult to control a gate voltage so as to turn on the second MOSFET for the completely same period as the period when the diode is conducting, and actually, it is used to have a period when both the MOSFET for chopping and the second MOSFET are turned off (dead time). During this dead time, the second MOSFET functions as a diode (pn junction diode) which is included as a parasitic element. The period is short, but the forward voltage drop thereof becomes a problem as the loss, all the same. Consequently, to reduce the forward voltage drop during the dead time, a structure in which schottky diodes are connected to the second MOSFET in parallel, is used.

Such a schottky diode is conceivable to be connected as a different component from the second MOSFET, but it is also conceivable to house in the second MOSFET from points of view of advantages in a converter configuration. There are some points to be considered when it is housed. One of them is a cost. In this means, the schottky diode having a structure which does not occupy too many areas on a semiconductor substrate, and not making processes excessively complicated, is desirable. Besides, it is also required to consider not to disturb functions as a basic schottky diode (for example, a low resistivity, a low leakage current, and so on) or functions as a transistor by removing these factors giving influences to the cost. Incidentally, as semiconductor elements in which a schottky barrier is intentionally formed within the semiconductor, for example, there are ones described in the following respective Patent Documents.

[Patent Document 1] Japanese Patent Laid-open Application No. Hei 11-251573

[Patent Document 2] Japanese Patent Laid-open Application No. 2003-17701

[Patent Document 3] U.S. Publication No. US-A1-2003/0207538

SUMMARY

A trench MOSFET according to an aspect of the present invention, including: a gate electrode having a trench gate structure; a gate insulating film formed to surround the gate electrode; an n-type diffusion layer formed to face the gate electrode via the gate insulating film at an upper portion of the trench; a p-type base layer formed to face the gate electrode via the gate insulating film at a lower portion than the upper portion of the trench; an n-type epitaxial layer locating to face the gate electrode via the gate insulating film at further lower portion than the lower portion of the trench; a metal layer formed departing from the trench in parallel with a depth direction of the trench, penetrating the n-type diffusion layer and the p-type base layer to reach the n-type epitaxial layer; and a p-type layer with higher impurity concentration than the p-type base layer, locating to be in contact with the p-type base layer and the metal layer.

Further, a trench MOSFET according to another aspect of the present invention, including: a gate electrode having a trench (first trench) gate structure; a gate insulating film formed to surround the gate electrode; an n-type diffusion layer formed to face the gate electrode via the gate insulating film at an upper portion of the first trench; a p-type base layer formed to face the gate electrode via the gate insulating film at a lower portion than the upper portion of the first trench; a second trench locating to face the first trench via the p-type base layer, respectively having an insulating film at a side wall surface and a p-type semiconductor layer at a bottom surface, and in which a conductor layer is embedded; an n-type epitaxial layer locating to face the gate electrode via the gate insulating film at a further lower portion than the lower portion of the first trench, and also locating at an opposite side of the second trench from a side in which the p-type base layer is located; and a metal layer formed to contact at an upper surface of the n-type epitaxial layer at the opposite side portion of the second trench from the side where the p-type base layer is located.

Further, a trench MOSFET according to still another aspect of the present invention, including: a gate electrode having a trench gate structure; a gate insulating film formed to surround the gate electrode; an n-type diffusion layer formed to face the gate electrode via the gate insulating film at an upper portion of the trench; a p-type base layer formed to face the gate electrode via the gate insulating film at a lower portion than the upper portion of the trench; a p-type semiconductor layer formed to face the trench via the p-type base layer, and to reach deeper than the trench; an n-type epitaxial layer locating to face the gate electrode via the gate insulating film at a further lower portion than the lower portion of the trench, and also locating at an opposite side of the p-type semiconductor layer from a side in which the p-type base layer is located; and a metal layer formed to contact at an upper surface of the n-type epitaxial layer at the opposite side portion of the p-type semiconductor layer from the side where the p-type base layer is located.

DETAILED DESCRIPTION

Description of Embodiments

Figure 1:
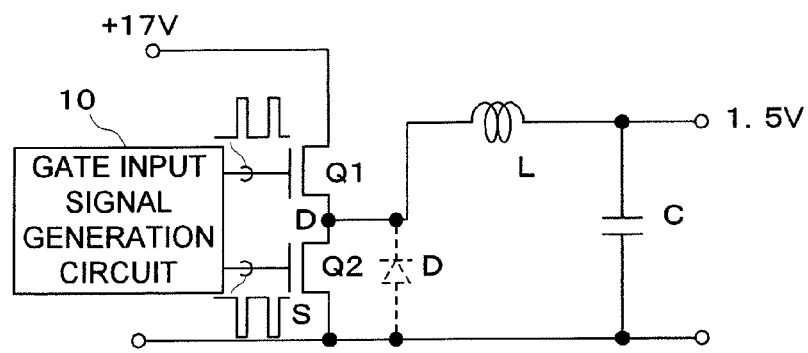
FIG. 1 is a view showing an example of a circuit when a trench MOSFET according to each embodiment of the present invention is used.

Embodiments of the present invention will be described with reference to the drawings, but these drawings are provided only for an illustrative purpose and by no means are intended to limit the present invention.

As for a trench MOSFET according to a mode of the present invention, in the trench MOSFET in which a p-type base layer facing a gate insulating film becomes a channel, there is a metal layer which penetrates an n-type diffusion layer, and further a p-type base layer, to reach an n-type epitaxial layer becoming a part of a drain region. Consequently, a junction from this metal layer to the n-type epitaxial layer becomes to be a schottky junction, and formed is a schottky diode having this junction whose forward direction is from the metal layer to the n-type epitaxial layer. Besides, this metal layer locates departing from the trench in parallel with a depth direction of the trench, and therefore, a planer area occupation thereof can be eliminated as same degree as the trench.

Consequently, in consideration with a cost, it is possible to house the schottky diode having the small area occupation on a semiconductor substrate. Incidentally, the reason why a p-type layer with a higher impurity concentration than the p-type base layer is provided at the position to be in contact with the p-type base layer and the metal layer is to certify that a conductivity between the metal layer and the p-type base layer is performed via an ohmic junction, and to secure an avalanche tolerance in a state that a backward voltage is applied to the schottky diode. It is a removal of a disturbing factor of functions.

As a form in this mode, a depth of the metal layer can be set to be shallower than the depth of the trench. Because it is structurally possible for the metal layer to reach the n-type epitaxial layer even if it is shallower than the trench. Incidentally, when a recessed portion to embed the metal layer is formed by the simultaneous process as the formation of the trench, the depths of them are to be the same degree.

Besides, as another form, the depth of the metal layer can be set to be shallower than the depth of the deepest portion of the p-type base layer. For example, when a thickness of the p-type base layer at the other region is set to be deeper than around the metal layer, this form is realized.

Besides, as still another form, the depth at the deepest portion of the p-type base layer can be set to be deeper than the depth of the trench and the depth of the metal layer. For example, the thickness of the p-type base layer at the other region is set to be deeper than around the trench and the metal layer, this form is realized.

Besides, as yet another form, an n-type layer with higher impurity concentration than the n-type diffusion layer locating sandwiched between the n-type diffusion layer and the metal layer, may further be included. For example, it is a form in which a contact to the n-type diffusion layer to be a source region from a source electrode layer is performed via the metal layer and the high impurity concentration n-type layer. Such high impurity concentration n-type layer can be selectively formed by using, for example, a high acceleration ion implantation method.

Besides, as for a trench MOSFET according to another mode, in the trench MOSFET in which a p-type base layer facing a gate insulating film becomes a channel, there is a trench (second trench) different from a trench (first trench) formed to face via a p-type base layer the first trench in which a gate electrode is embedded. The second trench each has an insulating film on a side wall surface, and a p-type semiconductor layer on a bottom surface, and further, an opposite side from a side where a p-type base layer is located, is an n-type epitaxial layer. At an upper surface of the n-type epitaxial layer of this portion, a metal layer is formed to contact. Consequently, a junction from this metal layer to the n-type epitaxial layer becomes to be a schottky junction, and formed is a schottky diode having this junction whose forward direction is from the metal layer to the n-type epitaxial layer. Besides, this metal layer is provided to be adjacent to the second trench, and therefore, a planar area occupation can be made smaller.

Consequently, in consideration with a cost, it is possible to house the schottky diode having the small area occupation on a semiconductor substrate. Incidentally, the reason why the bottom surface of the second trench is the p-type semiconductor layer, is to easily form a depletion layer at around the n-type epitaxial layer in a state when a backward voltage is applied to the schottky junction, and to suppress a leakage current of the schottky junction into a small level. It is a removal of a disturbing factor of functions.

As a form of this mode, the conductor layer of the second trench may be p-type polycrystalline silicon. It is a form to use polycrystalline silicon as an electric conductor. The reason why it is a p-type is to prevent a contact with the p-type semiconductor layer formed at the bottom portion of the second trench from being a pn junction. Besides, p-type polycrystalline silicon has a large work function difference with silicon, which is different from n-type polycrystalline silicon, and therefore, in the n-type epitaxial layer facing via the insulating film of the second trench, a depletion layer is easy to be spread from the second trench. Consequently, the leakage current of the schottky diode can further be suppressed, and the disturbing factor of the functions can further be removed.

Besides, as another form, the conductor layer of the second trench may be a metal. It is a form to use the metal as the electric conductor.

Besides, as still another form, the conductor layer of the second trench may be in contact and conducted with the metal layer at an upper surface thereof. It is an example of a structure to keep electric potentials of the conductor layer in the second trench and the metal layer to be the same.

Besides, as yet another form, the insulating film at the side wall surface of the second trench may be extendedly provided at the upper surface of the conductor layer of the second trench to isolate between the conductor layer and the metal layer. In this case, it is also preferable to keep the electric potentials of the conductor layer in the second trench and the metal layer to be the same, and for this purpose, a contact to the conductor layer is to be provided at an end portion in a longitudinal direction of the second trench.

Besides, as yet another form, the p-type semiconductor layer at the bottom surface of the second trench may be in contact with the p-type base layer. In accordance with a degree of a formation depth of the second trench relative to a formation thickness of the p-type base layer, or the degree of the formation thickness of the p-type semiconductor layer at the bottom surface of the second trench, this form is realized.

Besides, as yet another form, the gate insulating film may be integrated with the insulating layer protruding from the first trench into an upper portion. It is an example of a shape of the insulating layer to be the gate insulating film.

Besides, as for a trench MOSFET according to still another mode of the present invention, in the trench MOSFET in which a p-type base layer facing a gate insulating film becomes a channel, there is a p-type semiconductor layer formed to face a trench in which a gate electrode is embedded, via the p-type base layer, deeper than the trench. An opposite side of this p-type semiconductor layer from a side where the p-type base layer is located, is an n-type epitaxial layer. At an upper surface of the n-type epitaxial layer at this portion, a metal layer is formed to contact. Consequently, a junction from this metal layer to the n-type epitaxial layer becomes to be a schottky junction, and formed is a schottky diode having this junction whose forward direction is from the metal layer to the n-type epitaxial layer. Besides, this metal layer is provided to be adjacent to the p-type semiconductor layer, and therefore, a planar area occupation can be made smaller.

Consequently, in consideration with a cost, it is possible to house the schottky diode having the small area occupation on a semiconductor substrate. Incidentally, the p-type semiconductor layer is formed deeper than the trench, and therefore, a formation of a depletion layer at around the n-type epitaxial layer in a state when a backward voltage is applied to the schottky junction is spread more largely, and it is possible to suppress a leakage current of the schottky junction into a small level. It is a removal of a disturbing factor of functions.

As a form of this mode, the gate insulating film may be integrated with the insulating layer protruding from the trench into the upper portion. It is an example of a shape of the insulating layer to be the gate insulating film.

Besides, as another form, the p-type semiconductor layer may have a trench structure. Namely, it is a form in which the trench is formed, and thereafter, the p-type semiconductor layer is embedded inside thereof. Other than this form, such p-type semiconductor layer can be formed by an ion implantation.

Besides, as still another form, the trenches may be formed in plural in parallel with each other, and a missing of the trench exists at a formation pitch thereof. It is a form to form the schottky junction at the missing portion of the trench.

Besides, as yet another form, the trenches may be formed in plural in parallel with each other, and the formation pitch thereof is almost uniform. It is a form to form the p-type semiconductor layer and the portion of the schottky junction between the trenches formed with the uniform pitch. Herewith, it becomes possible to mixedly house the schottky diode without expanding cell pitches, and an on-resistance as the MOSFET does not increase because the area as the MOSFET does not increase.

Thinking of the above, hereinafter, embodiments of the present invention will be described with reference to the drawings. FIG. 1 is a view showing an example of a circuit (DC-DC converter) using a trench MOSFET according to respective embodiments of the present invention. The trench MOSFET used in FIG. 1 is a transistor Q2, and at first, a function of the transistor Q2 is described.

FIG. 1 is a circuit (DC-DC converter) in which a high input voltage (for example, 17 V) is applied between input terminals (primary side) at a left side in the drawing and obtains a low output voltage (for example, 1.5 V) between output terminals (secondary side) at a right side in the drawing. These voltage ratio can be set by a duty ratio of a switching (chopping) at a transistor Q1. When the transistor Q1 is turned on, a current flows from the primary side to the secondary side. When the transistor Q1 is turned off, the current at the second side flows back in a direction as it is, and therefore, the transistor Q2 is turned on. A set of an inductor L and a capacitor C is a low pass filter. Gate input signals of approximately inverting phase generated at a gate input signal generation circuit 10 are supplied to the respective gates of the transistors Q1 and Q2, to control the turning on/off of the transistors Q1 and Q2.

Normally, it is possible to flow back the current when the transistor Q1 is turned off, by providing a diode D, and the transistor Q2 is not necessary. However, when the output voltage required at the secondary side is low, a forward voltage drop of the diode D becomes large not to be ignored as a loss, and it is necessary to make the voltage lower. Consequently, the transistor Q2 which is turned on/off approximately in the inverting phase with the turning on/off of the transistor Q1 is provided as shown in the drawing.

Strictly speaking, a setting of the phase to turn on/off the transistors Q1 and Q2 is performed to provide a short period when the both are turned off, (a negative pulse width toward the Q2 is a little wider than a positive pulse width toward the Q1 shown by the pulse in the drawing). Herewith, it is possible to prevent an occurrence of a short-circuit period at the primary side. However, a diode as a structural parasitic element is turned on at the normal transistor Q2, by the occurrence of the period when both of the transistors Q1 and Q2 are turned off (dead time). The forward voltage drop of this diode cannot be ignored as a loss, none the less. Consequently, the transistor Q2 in each embodiment has the schottky diodes structurally built-in in parallel between a source and a drain. Herewith, it is possible to effectively lower the voltage between the source and the drain of the transistor Q2 during the dead time. Besides, as it is described in the following, it is considered to secure a low cost and a basic functionality as the transistor Q2.

Figure 12:
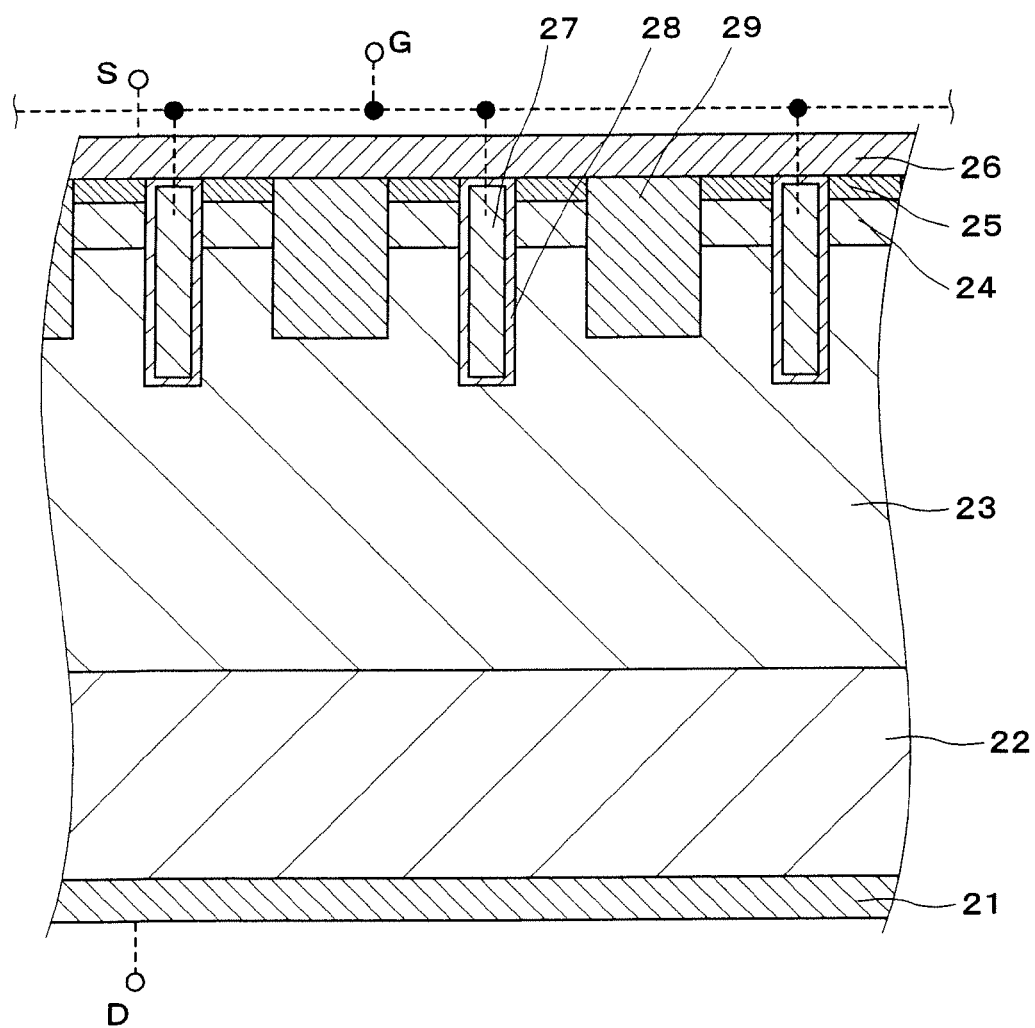
FIG. 12 is a sectional view schematically showing a structure of a trench MOSFET as a comparative example.

FIG. 12 is a sectional view schematically showing a structure of a trench MOSFET as a comparative example. At first, this comparative example is described. As shown in FIG. 12, this trench MOSFET has a drain electrode layer 21, an n+ layer 22, an n-type epitaxial layer 23, a p-type base layer 24, an n-type diffusion layer 25, a source electrode layer 26, gate electrodes 27, and gate insulating films 28. Incidentally, sizes in a horizontal direction in the drawing and in a vertical direction to the paper in the drawing are, for example, from 5 mm to 7 mm. The same pattern in the drawing is repeated in the horizontal direction, and it has the same cross-sectional structure with the drawing in the vertical direction to the paper. It is assumed that a current rating is from 10 A to 20 A, and a withstand voltage (backward voltage) is from 20 V to 30 V, in this comparative example and in the following respective embodiments at present, but they are not limited to these.

The drain electrode layer 21 is a conductive layer stacked on a side corresponding to a rear surface of a semiconductor substrate, namely on the n+ layer 22. For example, it can be formed from a lower side (n+ layer 22 side) as a stacked layer of a vanadium layer as a barrier layer, a nickel layer being a base metal, and further, a gold layer to prevent a corrosion. The n+ layer 22 is a semiconductor layer having a high n-type impurity concentration, and it is in ohmic junction with the drain electrode layer 21. The n-type epitaxial layer 23 locating at an opposite side of the n+ layer 22 with the drain electrode layer 21, is the semiconductor layer made by an epitaxial growth having a lower impurity concentration compared to the n+ layer 22. The n+ layer 22 and the n-type epitaxial layer 23 become to be a drain region as the MOSFET.

The p-type base layer 24 is the semiconductor layer formed, for example, by implanting and diffusing a p-type impurity into the n-type epitaxial layer 23. A region facing the later-described gate electrodes 27 via the gate insulating film 28 becomes to be a channel as the MOSFET. The n-type diffusion layer 25 is the semiconductor layer formed, for example, by implanting and diffusing the n-type impurity into the n-type epitaxial layer 23. The n-type diffusion layer 25 becomes to be the source region as the MOSFET. The source electrode layer 26 is a conductive layer formed on the n-type diffusion layer 25. For example, it can be formed from the lower side (n-type diffusion layer 25 side) as the stacked layer of a titanium layer as the barrier layer and an aluminum layer being a base metal.

The gate electrode 27 is a semiconductor conductive layer composed of, for example, polycrystalline silicon embedded inside of a trench formed penetrating the n-type diffusion layer 25 and the p-type base layer 24 to cut into the n-type epitaxial layer 23. The trench has a shape extending in the vertical direction to the paper in the drawing. As shown in the drawing, a plenty of trenches are formed in parallel, and pitches thereof can be set, for example, from 1 μm to 2 μm. The respective gate electrodes 27 having trench gate structures are connected to, for example, a common electrode of aluminum at both end portions thereof, and they become to be one terminal (gate terminal). The gate insulating film 28 is, for example, an oxide film formed to surround the gate electrodes 27.

The metal layer 29 is the conductive layer formed departing from the trench in parallel with the depth direction of the trench, penetrating the n-type diffusion layer 25 and the p-type base layer 24, and to cut into the n-type epitaxial layer 23. A formation method thereof is, for example, to form other trench than the trench for the gate electrode 27 formation, at the n-type diffusion layer 25, the p-type base layer 24, and the n-type epitaxial layer 23, and the metal layer is embedded inside thereof. For example, titanium can be used as a material thereof.

According to the trench MOSFET having a constitution as described above, in addition to a normal MOSFET constituted by the source region of the n-type diffusion layer 25, the channel of the p-type base layer 24, the drain region of the n-type epitaxial layer 23, the gate insulating film 28, and the gate electrodes 27, formed is a plenty of schottky diodes made by the junction between the metal layers 29 and the n-type epitaxial layer 23 to be housed. This schottky diode is in a forward direction from the source electrode layer 26 side to the drain electrode layer 21 side, and it can be a good bypass route of the current when the above-stated MOSFET is turned off. Besides, a switching of the current with the MOSFET portion is quick and a desirable flow back of the current is possible compared to the case when an external schottky diode is provided. When the external schottky diode is provided, an inductor component is included at a conductor portion, and therefore, the switching of the current becomes late.

Further, the metal layers 29 are formed by using the regions between the trenches of the gate electrodes 27 to make this as a metal electrode side of the schottky diode, and therefore, total area as a device is seldom increased. Besides, a current density is diffused as a whole, since a plurality of schottky diodes are formed, and therefore, there is an advantage that a factor to increase the forward voltage does not occur.

Incidentally, as it is obvious by referring to FIG. 1, when the drain electrode layer 21 side is positive, and the source electrode layer 26 side is negative, the transistor Q1 is turned on and the trench MOSFET (Q2) according to this embodiment is turned off. Besides, the backward voltage is applied to the schottky diodes formed inside. At this time, in the n-type epitaxial layer 23, depletion layers are spreading from around the p-type base layer 24, and further, from around the metal layers 29. However, formation regions of the depletion layers at around side surfaces of the metal layers 29 are relatively small. Consequently, a leakage current (a backward current of the schottky diode) may be concerned according to usage conditions thereof. In such a case, it is conceivable that the material of the metal layer 29 is changed to use the material in which the leakage current becomes small. For example, platinum or platinum silicide is usable.

As described above, the trench MOSFET as the comparative example shown in FIG. 12 achieves the built-in of the schottky diodes, but structurally, there is a case when the leakage current is concerned. Further, it is probable that there are cases when enough specifications cannot be secured from points of views of a withstand voltage at the portion functioning as the MOSFET, and an avalanche tolerance. Those become more obvious by comparison with respective embodiments described below.

Figure 2:
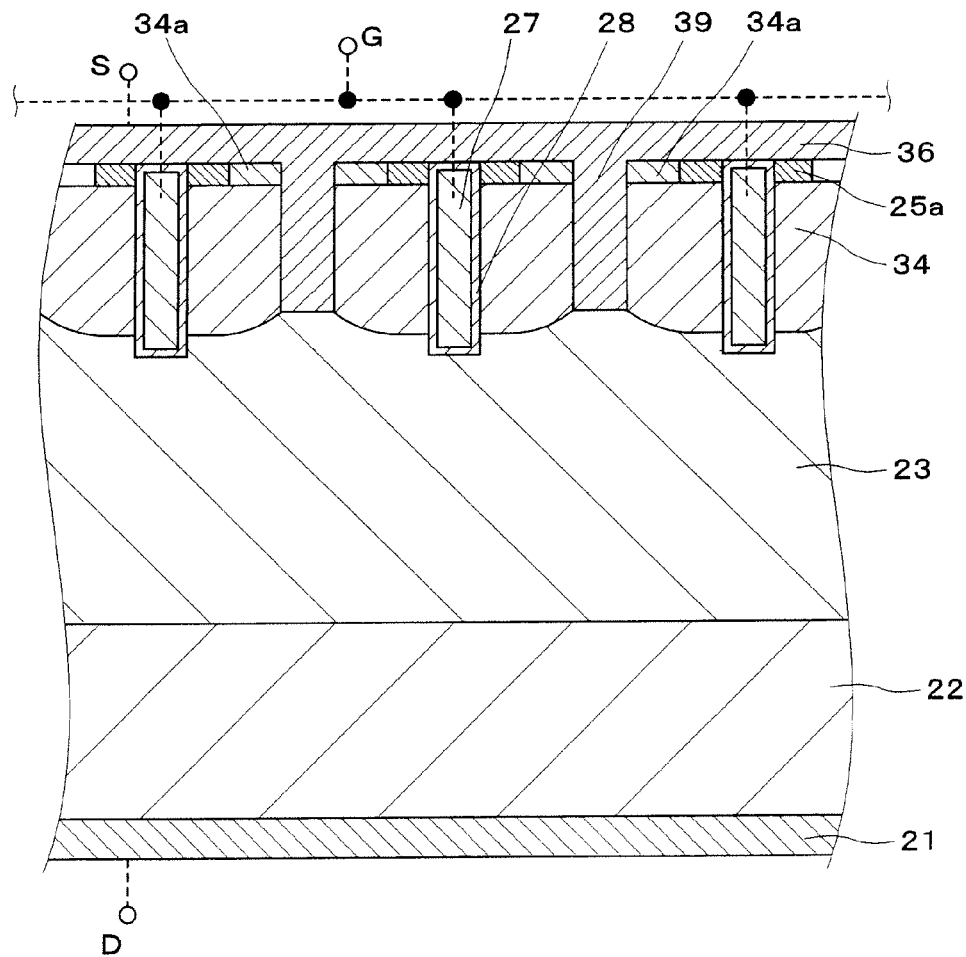
FIG. 2 is a sectional view schematically showing a structure of a trench MOSFET according to an embodiment of the present invention.

FIG. 2 is a sectional view schematically showing a structure of a trench MOSFET according to an embodiment of the present invention. In FIG. 2, the same reference numerals and symbols in FIG. 12 are used to designate the same and corresponding elements, and the detailed description thereof will not be given except for the case when there is something to add.

In this embodiment, it is upgraded so that schottky junction regions of metal layers 39 and an n-type epitaxial layer 23 are formed only at lower surfaces of the metal layers 39. Consequently, a leakage current when a backward voltage is applied can be made small. Namely, depletion layers spreading from around p-type base layers 34 into the n-type epitaxial layer 23 when the backward voltage is applied, cover junction portions with the metal layers 39 easily, and a state in which the leakage current is made smaller can be made. Besides, since the areas where the gate electrodes 27 and the epitaxial layer 23 are facing via the gate insulating films 28 are decreasing, capacities between gates and drains are decreased, and there is also an effect to improve an operation speed (switching speed).

N-type diffusion layers 25a have the same function as the n-type diffusion layers 25 in FIG. 12, but high concentration p-type layers 34a are formed at a part of the region thereof, and they are injunction with the metal layers 39. The high concentration p-type layers 34a can be formed, for example, discontinuously (at intervals) in a vertical direction to the paper in the drawing. Herewith, the metal layers 39 can respectively secure ohmic junctions with n-type semiconductors via the n-type diffusion layers 25a and with p-type semiconductors (p-type base layer 34) via the high concentration p-type layers 34a. Consequently, an unintended schottky junctions between the metal layers 39 and the semiconductor layers are prevented, and herewith, an occurrence of a parasitic transistor can be prevented, to increase an avalanche tolerance.

The metal layer 39 is integrally formed with the source electrode layer 36. To form this, for example, a titanium layer as a barrier layer is formed inside of the trench and at an upper surface, and thereafter, an aluminum layer is formed to embed inside of the trench and to cover the upper surface.

To make a regional relation between the trenches of the gate electrodes 27, the trenches of the metal layers 39, and the p-type base layers 34 as shown in the drawing, for example, the following process can be performed. At first, a p-type layer to be a base of the p-type base layer 34 is formed at a little deep position of the n-type epitaxial layer 23 by an ion implantation. Next, the trenches for the metal layers 39 are formed penetrating this p-type layer to cut into the n-type epitaxial layer 23, and an n-type impurity is implanted into a bottom thereof. Subsequently, the impurity of the p-type layer is diffused, then the p-type base layer 34 to reach the bottom portions of the trenches of the metal layers 39, is formed. At this time, in the region where the n-type impurity is not implanted, the p-type region is more spread, and therefore, the p-type base layers 34 projecting downward between the trenches of the metal layers 39 as shown in the drawing are formed. After that, the trenches for the gate electrodes 27 are formed penetrating the p-type base layer 34 to cut into the n-type epitaxial layer 23.

Figure 3:
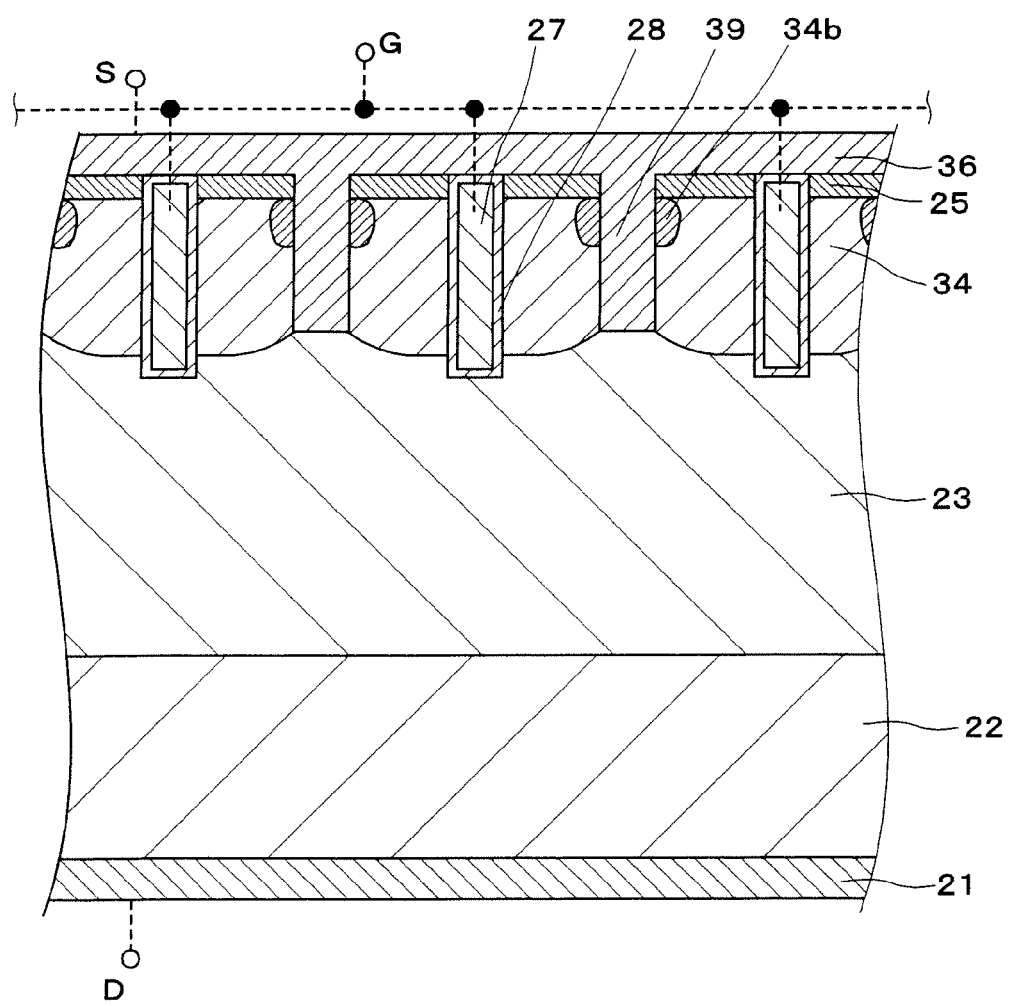
FIG. 3 is a sectional view schematically showing a structure of a trench MOSFET according to another embodiment of the present invention.

Next, a trench MOSFET according to another embodiment of the present invention is described with reference to FIG. 3. FIG. 3 is a sectional view schematically showing a structure of the trench MOSFET according to another embodiment of the present invention. In FIG. 3, the same reference numerals and symbols already shown are used to designate the same and corresponding elements, and the detailed description thereof may not be given except for the case when there is something to add.

In this embodiment, to secure ohmic junctions of metal layers 39 and p-type semiconductors, high concentration p-type layers 34b are located at a part sandwiched by regions of the p-type base layers 34 and the metal layers 39. The function thereof is the same as the high concentration p-type layer 34a in the embodiment shown in FIG. 2. However, in this embodiment, it has a structure in which junction areas between the high concentration p-type layers 34b and the metal layers 39 can easily be earned in a depth direction. Besides, it is not able to occur that the regions in the n-type diffusion layers 25a are made sacrificed as in the embodiment shown in FIG. 2, and therefore, pitches between the gate electrodes 27 can be set smaller. This is convenient for making an area narrower and a cost lower as a device.

Incidentally, formations of the high concentration p-type layers 34b as shown in the drawing can be made, for example, by selectively implanting, in plan view, a p-type impurity into a predetermined depth of the p-type base layers 34. For this purpose, for example, a high acceleration ion implantation method can be used.

Figure 4A:
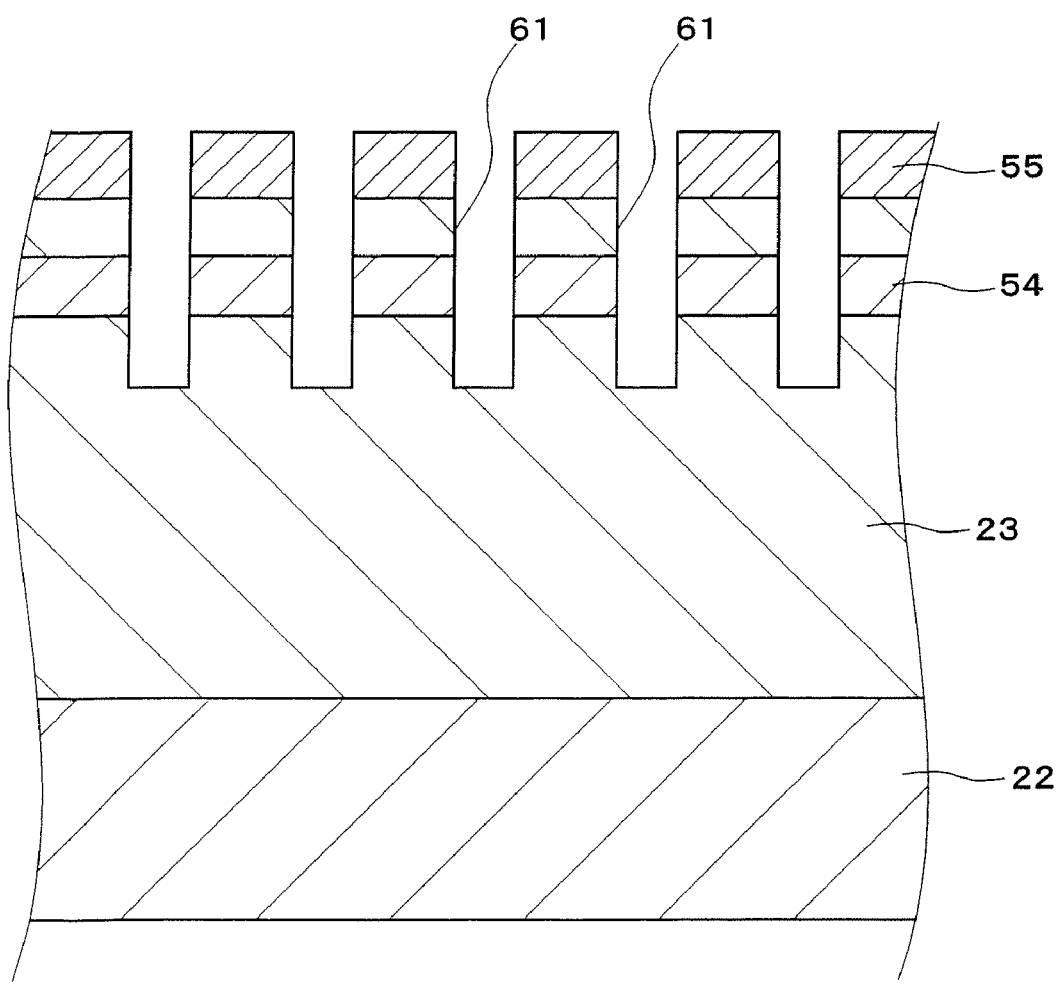
FIG. 4A and FIG. 4B are process charts showing manufacturing processes of a trench MOSFET according to still another embodiment of the present invention in schematic cross sections.
Figure 4B:
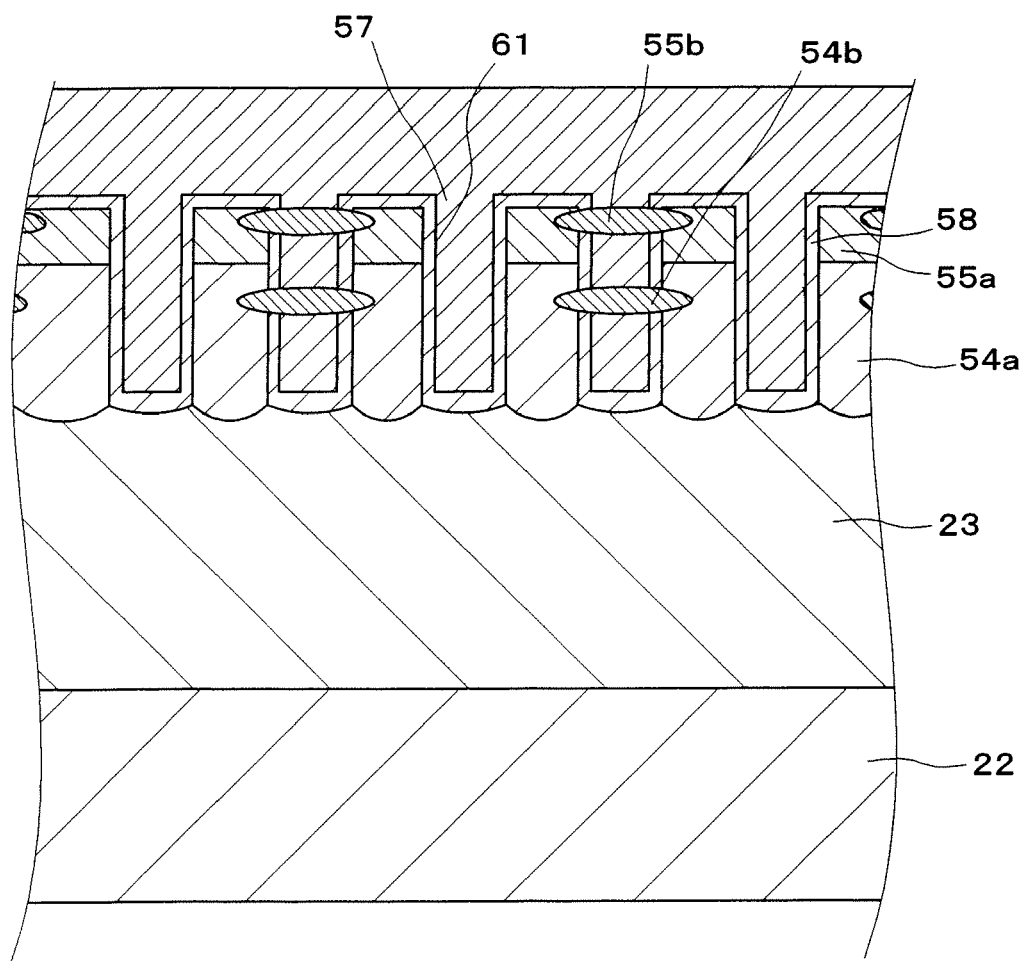
Figure 5:
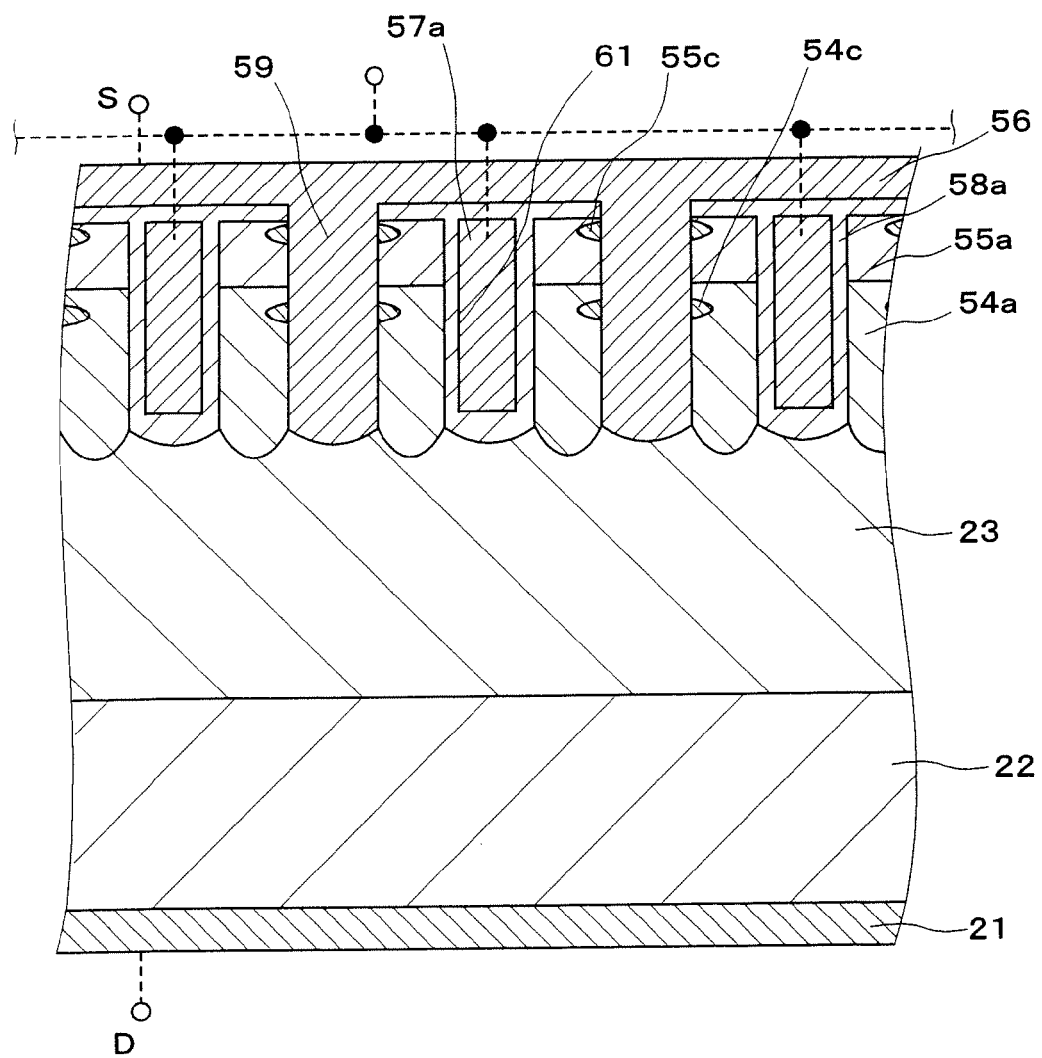
FIG. 5 is a subsequent view of FIG. 4B, and is a process chart showing the manufacturing process of the trench MOSFET according to still another embodiment of the present invention in schematic cross section.

Next, a trench MOSFET according to still another embodiment of the present invention is described with reference to FIG. 4A, FIG. 4B, and FIG. 5. FIG. 4A, FIG. 4B, and FIG. 5 are process charts showing manufacturing processes of the trench MOSFET according to still another embodiment of the present invention in schematic cross sections, and the processes progress in sequence of FIG. 4A, FIG. 4B, and FIG. 5. In FIG. 4A, FIG. 4B, and FIG. 5, the same reference numerals and symbols already shown are used to designate the same and corresponding elements, and the detailed description thereof may not be given.

In this embodiment, the trenches to form the metal layers 39 (29) and the trenches to form the gate electrodes 27 in the above-stated embodiment are formed by one simultaneous process, and the manufacturing process thereof can be simplified. Further, the advantage to make the pitches between the gate electrodes narrower in the embodiment shown in FIG. 3 and the advantages of the suppress of the leakage current of the schottky diodes, the reduction of the capacity between the gate and the drain, the increase of the avalanche tolerance, and so on are took over.

At first, with reference to FIG. 4A, phosphorus is high energy ion implanted into near a surface of an n-type epitaxial layer 23, boron is high energy ion implanted into a deep portion respectively, to form n-type layers 55 and p-type layers 54. Next, trenches 61 for metal layers and the trenches 61 for gate electrodes are formed at the same time. Phosphorus is then ion implanted into a bottom portion of the trenches 61, and regions with high n-type concentration are formed.

Next, with reference to FIG. 4B, an insulating film 58 is formed by performing an oxidation including inside walls of the trenches 61. At this time, at the bottom portion of the trenches 61, the insulating film 58 is thickly formed because of the region having the higher n-type concentration. Besides, the impurities within the n-type layers 55 and the p-type layers 54 are diffused, and the regions become large in thickness directions, to be n-type diffusion layers 55a and p-type base layers 54a. In particular, the p-type base layers 54a are more spread at the regions where the n-type impurity implanted into the bottom portion of the respective trenches 61 does not exist, and therefore, they become to be the p-type base layers 54a projecting downward between the respective trenches 61 as shown in the drawing.

Next, a polycrystalline silicon layer 57 is formed on an upper surfaces including insides of the respective trenches 61. Subsequently, as shown in the drawings, as for the trenches 61 in which the metal layers are embedded later, high concentration n-type layers 55b are formed at the depths of upper portions of the n-type diffusion layers 55a, and high concentration p-type layers 54b are formed at the depths of the p-type base layers 54a, respectively by means of the ion implantations. The high concentration n-type layers 55b and the high concentration p-type layers 54b are formed for ohmic contacts with the metal layers embedded insides of the trenches 61 later. These layers are not necessarily to be formed under a condition in which ohmic junctions with the n-type diffusion layers 55a and the p-type base layers 54a are possible to be formed without there layers.

Next, phosphorus is doped into the formed polycrystalline silicon layer 57, and further, the surface thereof is smoothed. The smoothed surface is then oxidized, and as shown in FIG. 5, gate electrodes 57a are formed in isolation. At this time, a gate insulating film 58a is formed with a part of the insulating film 58 and an oxide insulating film at a surface layer of the polycrystalline silicon layer 57. Next, the trenches are dug again alternately so as to remove all of the polycrystalline silicon layer 57 and the insulating film 58 to obtain the trenches for forming metal layers 59. At this time, a part of the high concentration n-type layers 55b and the high concentration p-type layers 54b are removed along the trench shape to become high concentration n-type layers 55c and high concentration p-type layers 54c as final shapes.

Next, the metal layers 59 and a source electrode layer 56 are formed by depositing a metal layer at an upper surface including insides of the dug again trenches. Besides, a drain electrode layer 21 is formed on an n+ layer 22 corresponding to a rear surface of the semiconductor substrate. As materials of the metal layers 59 and the source electrode layer 56, for example, tungsten, or aluminum using titanium or platinum silicide as a barrier layer can be used.

Figure 6:
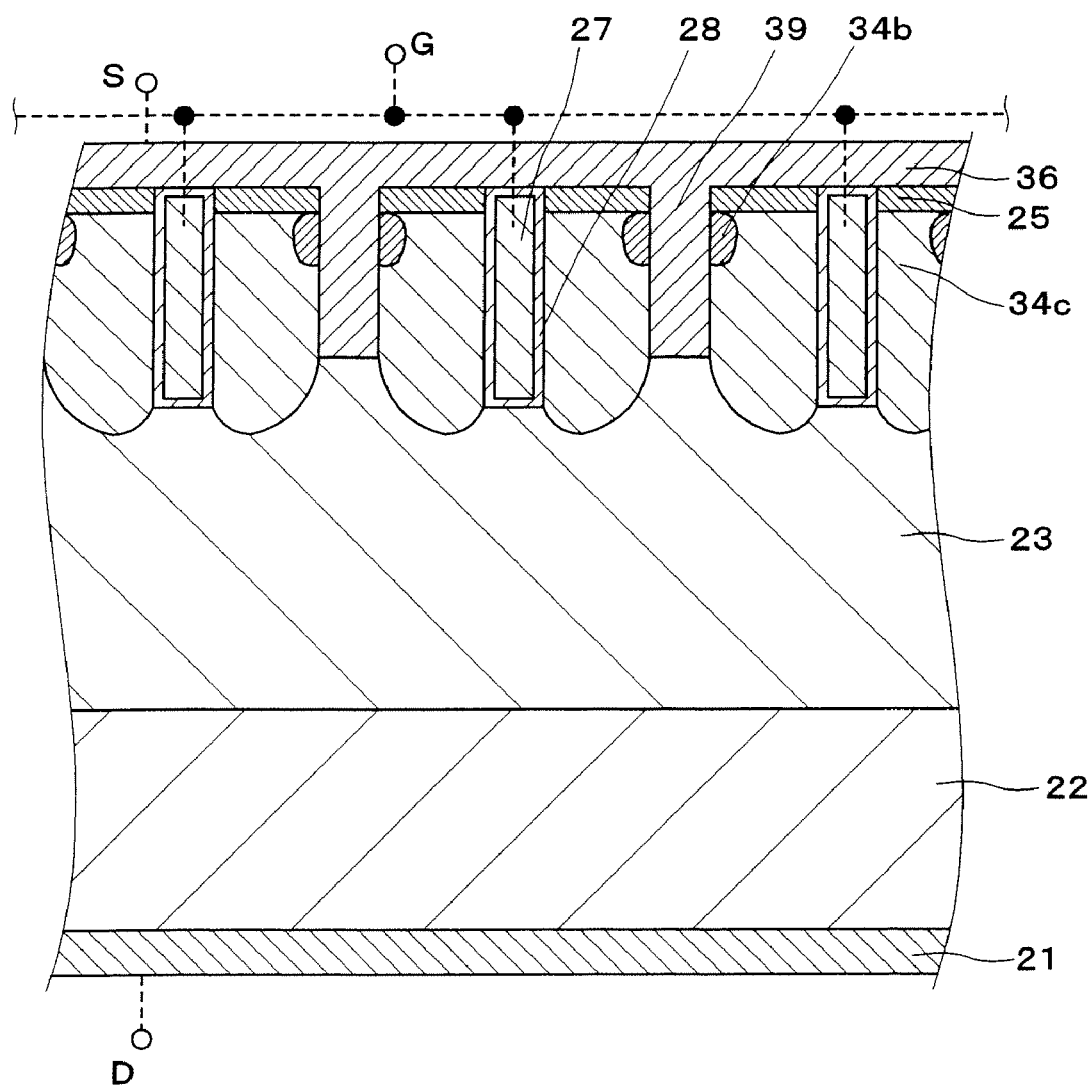
FIG. 6 is a sectional view schematically showing a structure of a trench MOSFET according to yet another embodiment of the present invention.

Next, a trench MOSFET according to yet another embodiment of the present invention is described with reference to FIG. 6. FIG. 6 is a sectional view schematically showing a structure of the trench MOSFET according to yet another embodiment of the present invention. In FIG. 6, the same reference numerals and symbols already shown are used to designate the same and corresponding elements, and the detailed description thereof may not be given except for the case when there is something to add.

The structure of the trench MOSFET of this embodiment is almost the same as the one shown in FIG. 3. The difference is that formation regions in a depth direction of p-type base layers 34c are different from the one shown in FIG. 3. To make such a structure, the p-type base layers 34c are to be formed by diffusing p-type layers in the depth direction after trenches for gate electrodes 27 and the trenches for metal layers 39 are formed, as same as the embodiment referring to the above-stated FIG. 4A, FIG. 4B, and FIG. 5.

Hereinabove, the comparative example and the four embodiments are described, and speaking from point of view of regions, in the modes of FIG. 12, FIG. 2, and FIG. 3, the depths of the metal layers 29 and 39 are shallower than the depths of the trenches of the gate electrodes 27. Besides, in the modes of FIG. 2, FIG. 3, FIG. 5, and FIG. 6, the depths of the metal layers 39 and 59 are shallower than the depths of the deepest portions of the p-type base layers 34, 54a, and 34c. Further, in the modes of FIG. 5 and FIG. 6, the depths of the deepest portions of the p-type base layers 54a and 34c are deeper than the depths of the trenches of the gate electrodes 57a and 27, and the depths of the metal layers 59 and 39.

Figure 7:
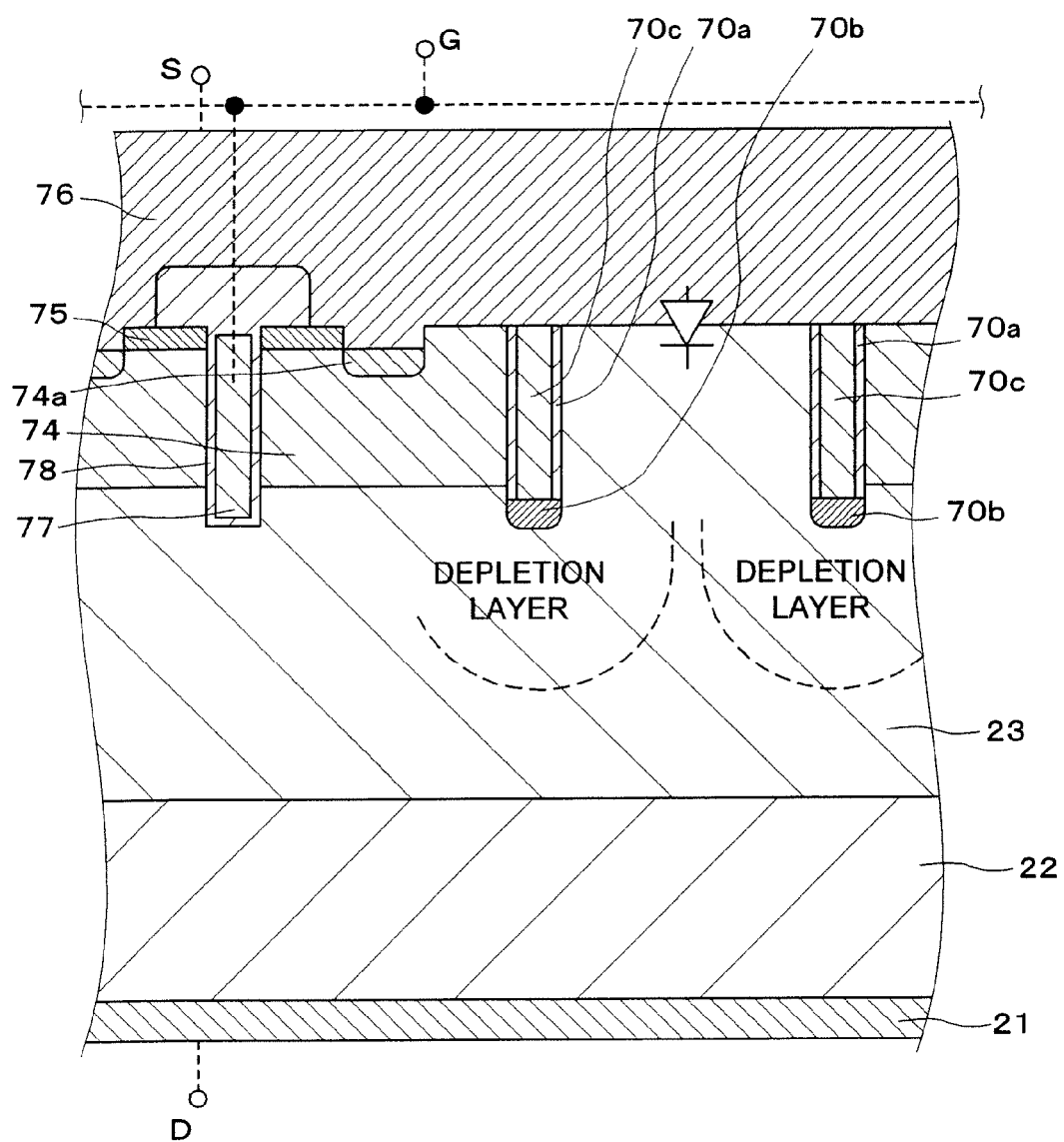
FIG. 7 is a sectional view schematically showing a structure of a trench MOSFET according to yet another embodiment of the present invention.

Next, a trench MOSFET according to yet another embodiment of the present invention is described with reference to FIG. 7. FIG. 7 is a sectional view schematically showing a structure of the trench MOSFET according to yet another embodiment of the present invention. In FIG. 7, the same reference numerals and symbols already shown are used to designate the same and corresponding elements, and the detailed description thereof may not be given except for the case when there is something to add.

As shown in FIG. 7, this trench MOSFET has p-type base layers 74, n-type diffusion layers 75, a source electrode layer 76, gate electrodes 77, and gate insulating films 78, in addition to a drain electrode layer 21, an n+ layer 22, and an n-type epitaxial layer 23. Besides, there are second trenches facing the gate electrodes 77, and they have filling structures in which there are an insulating film 70a on a side wall and a p-type semiconductor layer 70b at a bottom portion inside thereof, and there is a conductor layer 70c in further inside. Besides, a part of an upper surface of the p-type base layer 74 is a high concentration p-type layer 74a having high concentration of a p-type impurity, and thereby, a certain ohmic junction with the source electrode layer 76 can be obtained.

The respective functions of the p-type base layer 74, the n-type diffusion layer 75, the source electrode layer 76, the gate electrode 77, and the gate insulating film 78 are respectively the same as those of the p-type base layers 34, 54a, and 34c, the n-type diffusion layers 25a, 25, and 55a, the source electrode layers 36 and 56, the gate electrodes 27 and 57a, and the gate insulating films 28 and 58a in the embodiments cited above. However, in this embodiment, the gate insulating film 78 surrounding the gate electrode 77 in the trench, is integrated with the insulating film protruding from the trench into an upper portion. To obtain such an insulating film structure, the gate electrode 77 and the gate insulating film 78 in the trench are formed, and thereafter, for example, the insulating film is accumulated on a whole surface, and then, performed is a selective etching so as to leave the insulating film at the region as shown in the drawing.

Besides, the second trench composed of the conductor layer 70c, and so on, is facing the p-type base layer 74 at one side, but at an opposite side, the p-type base layer 74 is not formed, and the n-type epitaxial layer 23 is spreading up to the surface of the semiconductor region. To form the p-type base layer 74 at the selective region like this, for example, the second trench is formed, and thereafter, a p-type impurity is implanted via a mask formed at a predetermined region and is diffused. Besides, as for the second trench, as it is different from the trench for the gate electrode 77, there is no facing with the n-type diffusion layer 75 on any side. To form the n-type diffusion layer 75 at such a selective region, for example, a mask formed at the predetermined region may also be used.

The p-type semiconductor layer 70b at the bottom portion of the second trench can be formed by forming the trench, forming an oxide film at an inner wall and a bottom surface thereof, thereafter, selectively removing the insulating film at the bottom surface, and further, implanting the p-type impurity into the bottom portion of the trench. This p-type semiconductor layer 70b may be formed to be in contact with the p-type base layer 74. A material of conductor layer 70c filling inside may be, for example, p-type polycrystalline silicon. When it is an n-type, the contact with the p-type semiconductor layer 70b become to be a pn junction, and therefore, it is not preferable. Instead of p-type polycrystalline silicon, a metal (metal silicide) can be used. The conductor layer 70c is in contact with the source electrode layer 76 at an upper surface thereof, but a part (for example, at intervals) in the vertical direction to the paper in the drawing may be in contact with the source electrode layer 76 without being contacted by the whole trench.

In the trench MOSFET having the structure as described above, the contact portion of the n-type epitaxial layer 23 spreading up to the surface of the semiconductor region and the source electrode layer 76 being the metal layer becomes to be a schottky junction. Here, at the bottom portion of the trenches adjacent to the n-type epitaxial layer 23 in the region of the schottky junction, the p-type semiconductor layers 70b play a roll to eliminate the leakage current in this schottky junction. Namely, in a state when a backward voltage is applied to the schottky junction, the depletion layers are formed at the n-type epitaxial layer 23 around the p-type semiconductor layers 70b as shown in the drawing, a carrier concentration taking a charge of the current is lowered, a contribution of an electric field to around an interface of the schottky junction is reduced, and therefore, the leakage current can be reduced.

In the drawing, one unit is shown in the horizontal direction, and in this case, two second trenches (namely, one schottky diode) are provided for one trench of the gate electrode 77. However, it is not limited to this, and a layout in which two or more trenches of the gate electrode 77 are adjacent, and the two or more trenches each has one schottky diode, may be acceptable.

Figure 8:
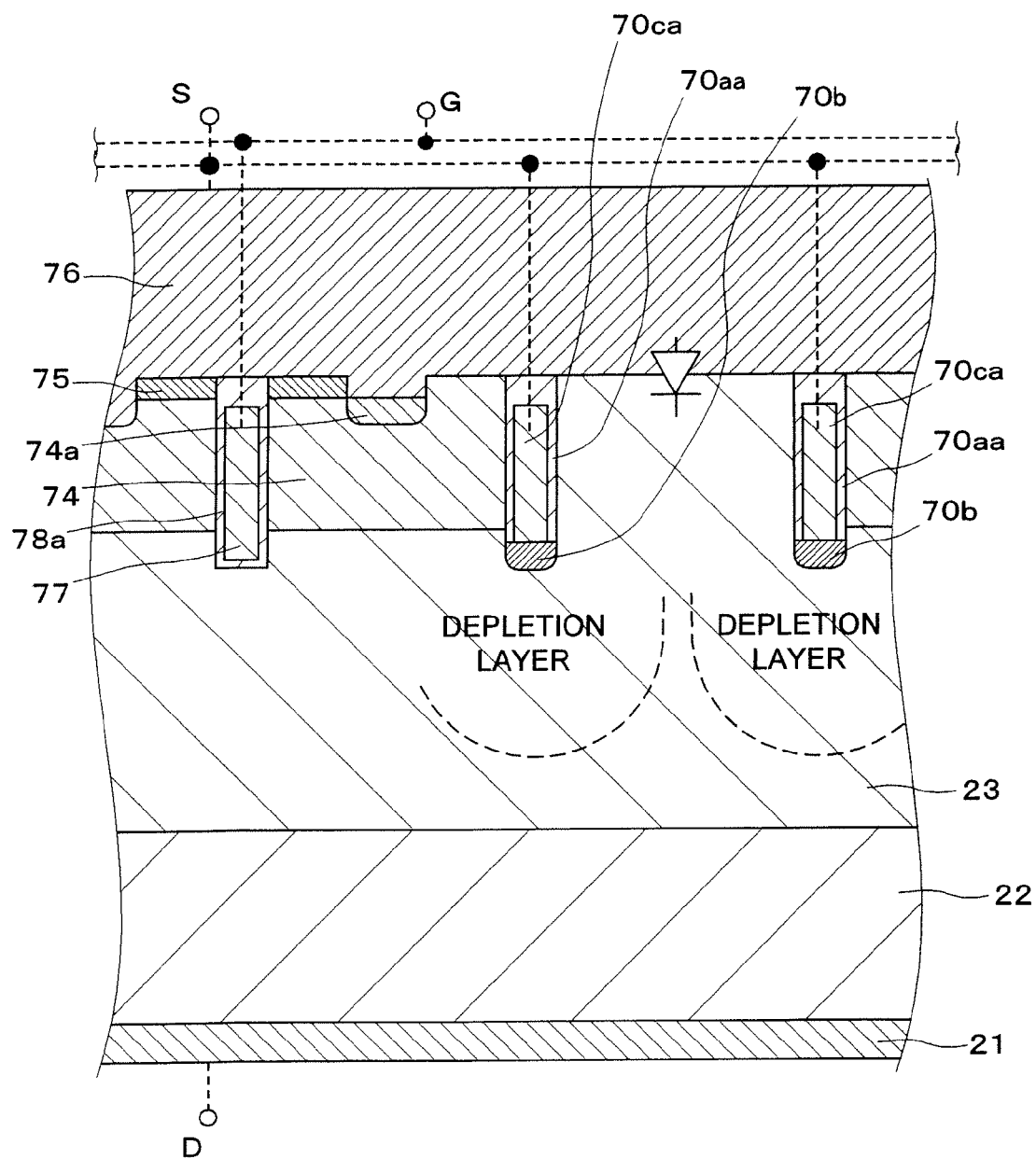
FIG. 8 is a sectional view schematically showing a structure of a trench MOSFET according to yet another embodiment of the present invention.

Next, a trench MOSFET according to yet another embodiment of the present invention is described with reference to FIG. 8. FIG. 8 is a sectional view schematically showing a structure of the trench MOSFET according to yet another embodiment of the present invention. In FIG. 8, the same reference numerals and symbols already shown are used to designate the same and corresponding elements, and the detailed description thereof may not be given except for the case when there is something to add.

In this embodiment, a point is different that the gate insulating film 78 in the embodiment shown in FIG. 7 becomes to be a gate insulating film 78a which is not integrated with the insulating film protruding outside of the trench. Further, as for the second trenches, a point is different that an upper surface of conductor layer 70ca is covered with an insulating film 70aa in the same mode with the gate electrode 77, but the rest are basically same.

The upper surface of the conductor layer 70ca is covered with the insulating film 70aa for intending to form both upper surface portions of the gate insulating film 78a and the insulating film 70aa at the same time. The formation of the upper surface portions of these insulating films are performed by, for example, oxidizing the upper surface portions of the embedded gate electrode 77 and the conductor layer 70ca at the same time to make them change into the insulating films. The material of the conductor layer 70ca may be, for example, p-type polycrystalline silicon or a metal, and to fix an electric potential thereof, for example, conductive paths are formed at both end portions in the vertical direction to the drawing so as to be in conduct with the source electrode layer 76.

Figure 9:
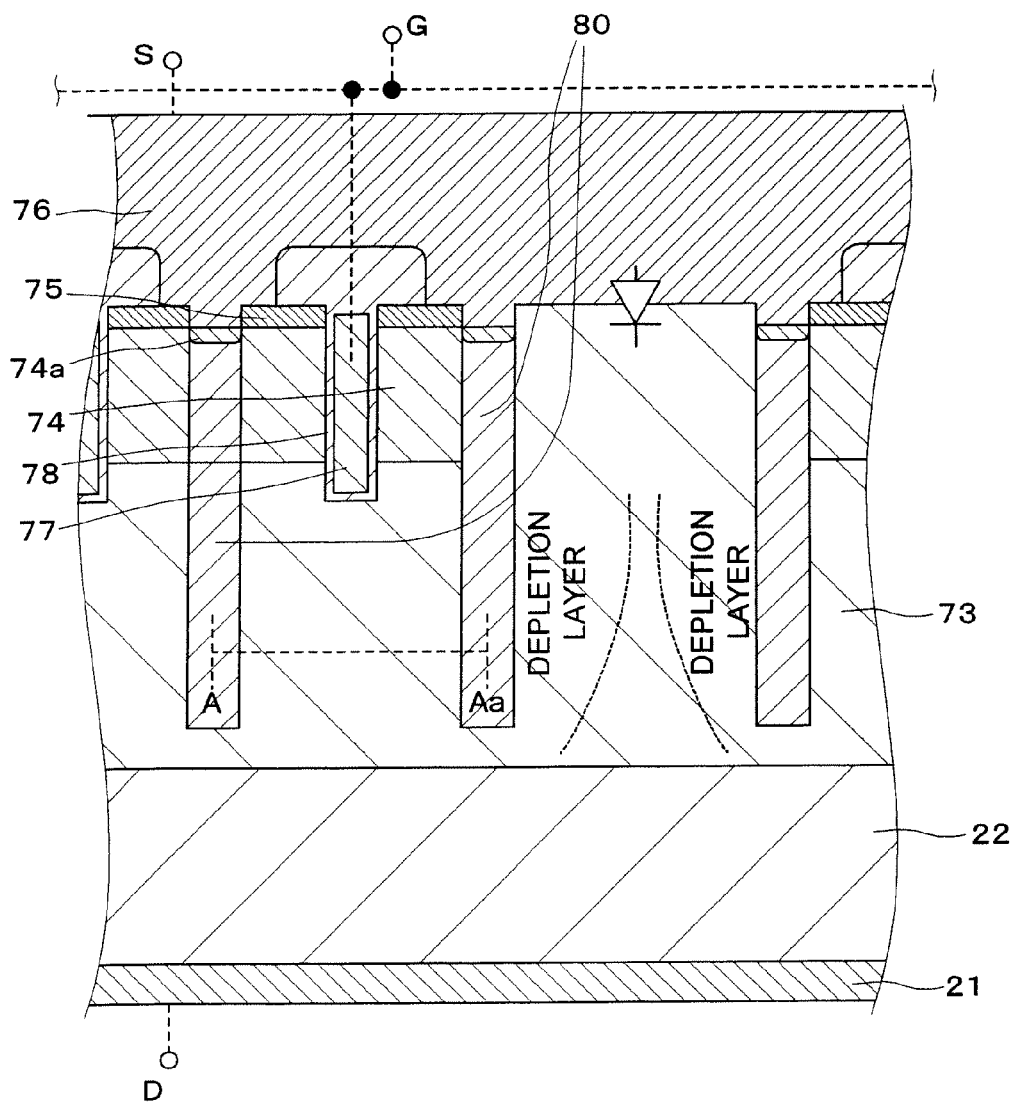
FIG. 9 is a sectional view schematically showing a structure of a trench MOSFET according to yet another embodiment of the present invention.

Next, a trench MOSFET according to yet another embodiment of the present invention is described with reference to FIG. 9. FIG. 9 is a sectional view schematically showing a structure of the trench MOSFET according to yet another embodiment of the present invention. In FIG. 9, the same reference numerals and symbols already shown are used to designate the same and corresponding elements, and the detailed description thereof may not be given except for the case when there is something to add.

In this embodiment, a point as follows is a large difference from the above-stated embodiments, that p-type semiconductor layers 80 are formed in wall state deeper than trenches for gate electrodes 77, between the trenches in which the gate electrodes 77 are embedded, and between the trench in which the gate electrode 77 is embedded and a region where a schottky junction is formed. According to such a structure, advantages as a MOSFET such as a high withstand voltage, and a low on-resistance, can further be obtained. Here, an n-type epitaxial layer 73 may have a higher impurity concentration than the n-type epitaxial layer 23 in the above-stated respective embodiments.

The p-type semiconductor layers 80 which are adjacent to regions where the n-type epitaxial layer 73 is exposing to an upper surface of a semiconductor region, have higher degrees to form depletion layers in the adjacent n-type epitaxial layer 73 from point of view of a shape thereof, than, for example, the p-type semiconductor layers 70b in the embodiment shown in FIG. 7. Consequently, even if the n-type epitaxial layer 73 has an impurity of high concentration, it is possible to reduce the leakage current of the schottky diode.

To form the p-type semiconductor layers 80 as shown in the drawing, for example, a method to form trenches, and fill inside thereof with p-type semiconductor layers, or a method to implant a p-type impurity into the n-type epitaxial layer 73 while changing implanting energies, can be adopted. A formation depth thereof depends on a withstand voltage specification, and for example, is approximately 10 μm or less when the withstand voltage is 100 V, and it is formed deeper according to becoming high withstand voltage.

In case of this embodiment, a ratio between the number of the trenches of the gate electrode 77 and the number of schottky diodes to be formed, can be differed largely according to a layout thereof, as same as the embodiment shown in FIG. 7.

Figure 10:
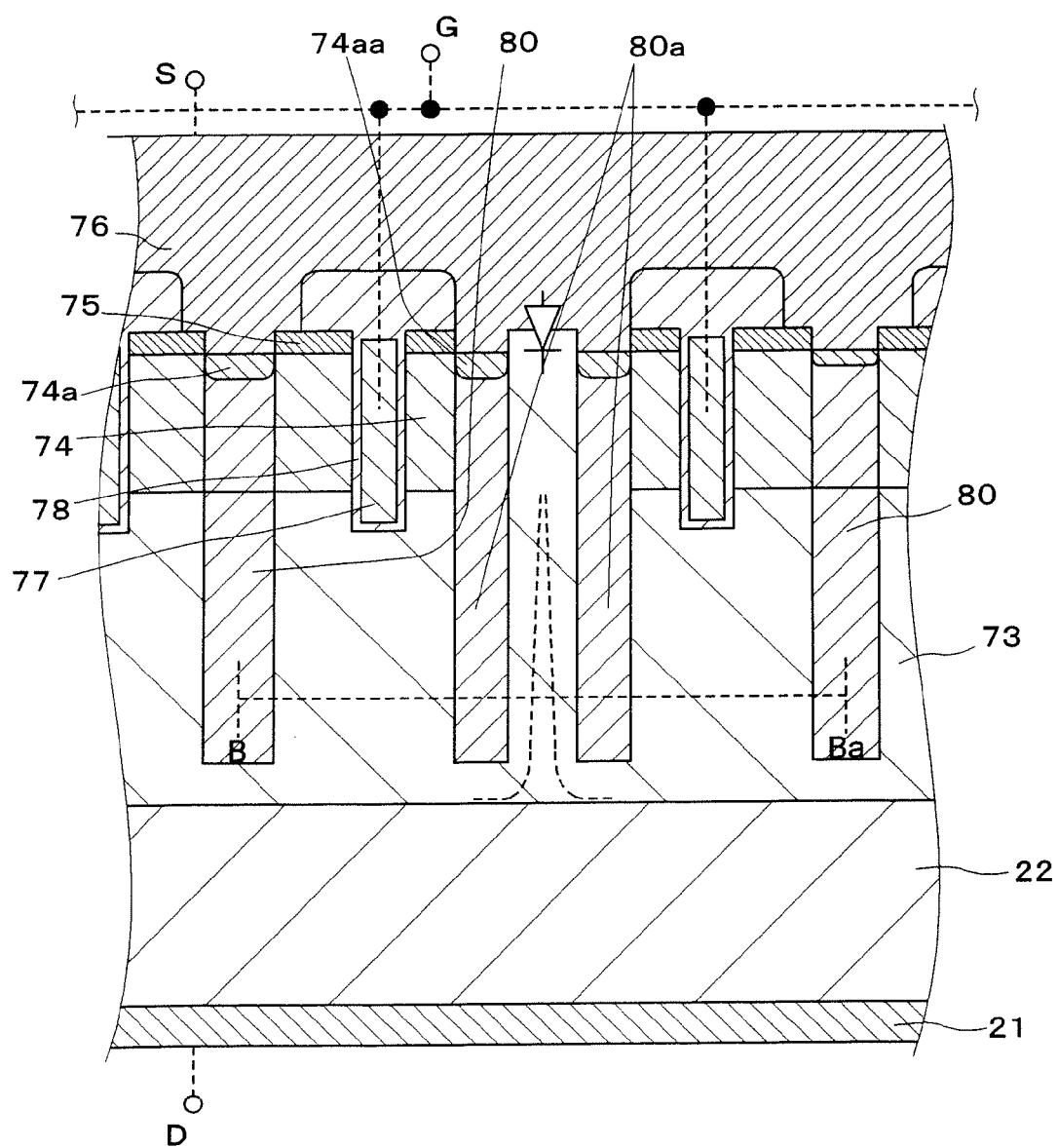
FIG. 10 is a sectional view schematically showing a structure of a trench MOSFET according to yet another embodiment of the present invention.

Next, a trench MOSFET according to yet another embodiment of the present invention is described with reference to FIG. 10. FIG. 10 is a sectional view schematically showing a structure of the trench MOSFET according to yet another embodiment of the present invention. In FIG. 10, the same reference numerals and symbols already shown are used to designate the same and corresponding elements, and the detailed description thereof may not be given except for the case when there is something to add.

In this embodiment, as shown in the drawing, a width of a region where a schottky diode is formed is saved. Namely, in the embodiment shown in FIG. 9, one of the trenches for the gate electrode 77 is sacrificed, and thereby, one schottky diode region is created. However, in this embodiment, the schottky diode region is formed without sacrificing any trenches for the gate electrode 77.

More concretely, two p-type semiconductor layers 80a different from the p-type semiconductor layer 80 between the trenches of the gate electrode 77, are formed in wall state to face each other at the region where the schottky diode is formed between the trenches of the gate electrode 77. It is preferable that depletion layers around the p-type semiconductor layers 80a formed at the n-type epitaxial layer 73 are further easy to be disturbances of a formation of a flowing path of the leakage current of the schottky diode, according to such a characteristic in shape. Incidentally, at an upper surface of the p-type semiconductor layers 80a, high concentration p-type layers 74aa are formed so that a junction with the source electrode layer 76 is to be an ohmic junction, as same as the p-type semiconductor layers 80.

Figure 11:
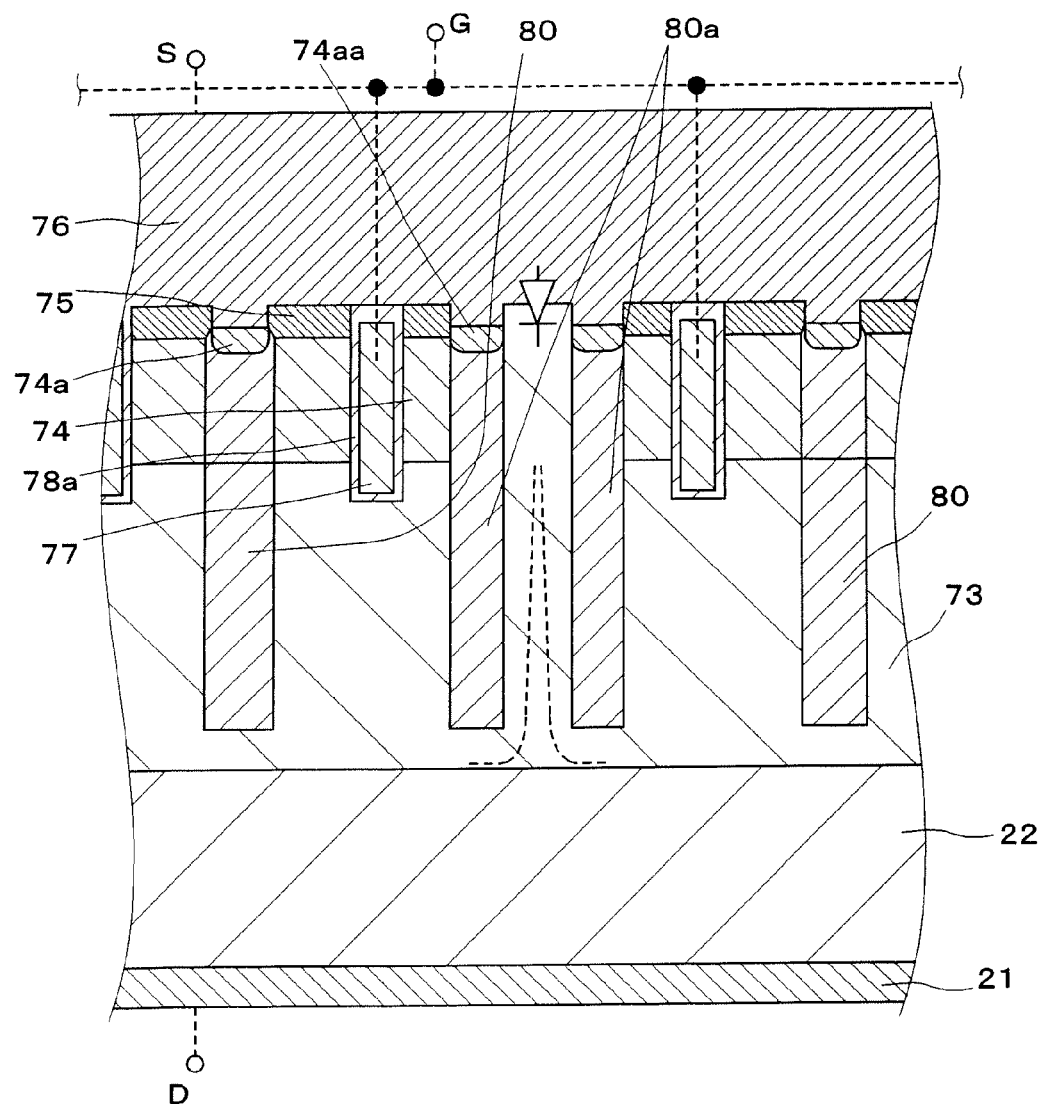
FIG. 11 is a sectional view schematically showing a structure of a trench MOSFET according to yet another embodiment of the present invention.

Next, a trench MOSFET according to yet another embodiment of the present invention is described with reference to FIG. 11. FIG. 11 is a sectional view schematically showing a structure of the trench MOSFET according to yet another embodiment of the present invention. In FIG. 11, the same reference numerals and symbols already shown are used to designate the same and corresponding elements, and the detailed description thereof may not be given except for the case when there is something to add.

In this embodiment, a point is different that the gate insulating film 78 in the embodiment shown in FIG. 10 are to be gate insulating film 78a which are not integrated with an insulating film protruding outside of trenches. The rest are basically the same.

Incidentally, the structures shown in FIG. 9 to FIG. 11, in which the longer-than-wide p-type semiconductor layers are disposed in the n-type epitaxial layer 73 at intervals in the horizontal direction in the drawing are generally called as super junction structures. In this structure, to make it to have the highest withstand voltage, and the lowest on-resistance characteristic, total volumes of the impurities of the p-type and the n-type in the horizontal direction at a normal unit cell shown by a line between A and Aa in FIG. 9 are made to be approximately equal. This corresponds that the total volumes of the impurities of the p-type and the n-type between the line between B and Ba in FIG. 10 are made to be equal, and therefore, a width of the p-type semiconductor layer 80*a* (in the horizontal direction in the drawing) is preferable to be adjusted to be narrower than that in the unit cell at a part of the MOSFET.

The present invention is not limited to the specific embodiments described here with the illustrations, but it is to be understood that all the changes and modifications without departing from the range of the following claims are to be included therein.

What is claimed is:

1. A trench MOSFET, comprising:
   a gate electrode having a trench gate structure;
   a gate insulating film formed to surround the gate electrode;
   an n-type diffusion layer formed to face the gate electrode via the gate insulating film at an upper portion of the trench;
   a p-type base layer formed to face the gate electrode via the gate insulating film at a lower portion than the upper portion of the trench;
   an n-type epitaxial layer locating to face the gate electrode via the gate insulating film at a further lower portion than the lower portion of the trench;
   a metal layer formed departing from the trench in parallel with a depth direction of the trench, the metal layer penetrating the n-type diffusion layer and the p-type base layer to reach the n-type epitaxial layer; and
   a p-type layer with higher impurity concentration than the p-type base layer, locating to be in contact with the p-type base layer and the metal layer.

2. A trench MOSFET as set forth in claim 1, wherein a depth of the metal layer is shallower than a depth of the trench.

3. A trench MOSFET as set forth in claim 1, wherein a depth of the metal layer is shallower than a depth of a deepest portion of the p-type base layer.

4. A trench MOSFET as set forth in claim 1, wherein a depth of a deepest portion of the p-type base layer is deeper than depths of the trench and the metal layer.

5. A trench MOSFET as set forth in claim 1, wherein side surfaces of the metal layer in a depth direction is not in contact with the n-type epitaxial layer.

6. A trench MOSFET as set forth in claim 1, further comprising:
   an n-type layer with higher impurity concentration than the n-type diffusion layer, locating between the n-type diffusion layer and the metal layer.

* * * * *